(12) United States Patent
Okuyama

(10) Patent No.: US 7,452,789 B2
(45) Date of Patent: Nov. 18, 2008

(54) METHOD FOR FORMING UNDERLAYER COMPOSED OF GAN-BASED COMPOUND SEMICONDUCTOR, GAN-BASED SEMICONDUCTOR LIGHT-EMITTING ELEMENT, AND METHOD FOR MANUFACTURING GAN-BASED SEMICONDUCTOR LIGHT-EMITTING ELEMENT

(75) Inventor: Hiroyuki Okuyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 7 days.

(21) Appl. No.: 11/620,511

(22) Filed: Jan. 5, 2007

(65) Prior Publication Data

US 2007/0164269 A1  Jul. 19, 2007

(30) Foreign Application Priority Data

Jan. 16, 2006  (JP) ............................. 2006-007238

(51) Int. Cl.
H01L 21/00 (2006.01)
H01L 21/36 (2006.01)
H01L 31/20 (2006.01)

(52) U.S. Cl. ...................... 438/484; 438/481; 438/483; 257/E21.165

(58) Field of Classification Search ................ 438/481, 438/483, 484; 257/E21.564, E21.165, E21.102
See application file for complete search history.

(56) References Cited

U.S. PATENT DOCUMENTS 3,211,042 A * 10/1965 Fischer ....................... 411/344
4,500,388 A * 2/1985 Ohmura et al. ................ 117/8
6,475,882 B1 * 11/2002 Sakai et al. .................. 438/483
7,148,092 B2 * 12/2006 Isobe et al. .................. 438/166
7,288,458 B2 * 10/2007 Adetutu et al. .............. 438/311
2003/0139037 A1 * 7/2003 Kobayashi et al. .......... 438/681
2004/0261692 A1 * 12/2004 Dwilinski et al. ............ 117/84
2005/0040385 A1 * 2/2005 Carven et al. ................ 257/14

FOREIGN PATENT DOCUMENTS

JP   2002-100579   4/2002

* cited by examiner

Primary Examiner—Scott B. Geyer
Assistant Examiner—Seahvosh J Nikmanesh
(74) Attorney, Agent, or Firm—Bell, Boyd & Lloyd LLP

(57) ABSTRACT

A method for forming an underlayer composed of a GaN-based compound semiconductor is provided. In this method, at the time of epitaxial growth of an underlayer on the surface of a sapphire substrate, no gap is generated between the underlayer and the surface of the sapphire substrate. The method for forming an underlayer composed of a GaN-based compound semiconductor includes the steps of forming strip seed layers composed of a GaN-based compound semiconductor on the surface of a sapphire substrate, forming a crystal growth promoting layer composed of a GaN-based compound semiconductor on the top surfaces and both the side surfaces of the seed layers, and on the exposed surfaces of the sapphire substrate, and epitaxially growing an underlayer composed of a GaN-based compound semiconductor from the parts of the crystal growth promoting layer.

17 Claims, 11 Drawing Sheets

C-PLANE {0001}
A-PLANE {11$\bar{2}$0}  M-PLANE {1$\bar{1}$00}

R-PLANE {1$\bar{1}$02}

S-PLANE {1$\bar{1}$01}

METHOD FOR FORMING UNDERLAYER COMPOSED OF GaN-BASED COMPOUND SEMICONDUCTOR, GaN-BASED SEMICONDUCTOR LIGHT-EMITTING ELEMENT, AND METHOD FOR MANUFACTURING GaN-BASED SEMICONDUCTOR LIGHT-EMITTING ELEMENT

CROSS REFERENCES TO RELATED APPLICATIONS

The present application claims priority to Japanese Patent Application JP 2006-007238 filed with the Japanese Patent Office on Jan. 16, 2006, the entire contents of which is being incorporated herein by reference.

BACKGROUND

The present application relates to a method for forming an underlayer composed of a GaN-based compound semiconductor, a GaN-based semiconductor light-emitting element, and a method for manufacturing the same.

In recent years, in order to form a GaN-based compound semiconductor layer having low crystal defect density, various studies have been conducted on methods to grow a GaN-based compound semiconductor layer on a sapphire substrate in a lateral direction (hereinafter, the methods will be referred to as epitaxial growth in a lateral direction or epitaxial lateral overgrowth (ELO)). In general, if plural seed layers that are composed of a GaN-based compound semiconductor and separate from each other are formed on a sapphire substrate, a GaN-based compound semiconductor layer is laterally grown from the seed layers. In the region in which the GaN-based compound semiconductor layer is laterally grown, dislocations propagate only in a lateral direction along with the crystal growth of the GaN-based compound semiconductor layer, but do not penetrate the GaN-based compound semiconductor layer in the vertical direction (thickness direction) of the layer. Therefore, a GaN-based compound semiconductor layer that has low crystal defect density can be obtained.

One of such ELO methods is disclosed in e.g. Japanese Patent Laid-open No. 2002-100579. The technique disclosed in Japanese Patent Laid-open No. 2002-100579 includes a step of forming growth nuclei composed of a nitride semiconductor on a heterogeneous substrate that is not composed of a nitride semiconductor into a cyclic stripe, island, or grid shape, and a growth step of growing nitride semiconductor layers from the growth nuclei so that the nitride semiconductor layers are joined to each other at substantially the midpoints between the growth nuclei and cover the entire face of the substrate. In this growth step, after the nitride semiconductor layers are halfway grown, a protective film is formed above the growth nuclei, and then the nitride semiconductor layers are further grown.

In general, in formation of a GaN-based compound semiconductor layer on a sapphire substrate, the C-plane of the sapphire substrate is used. In a GaN-based compound semiconductor layer formed on the C-plane of a sapphire substrate based on an ELO method, the top surface thereof is the C-plane while the side surface thereof is the A-plane. Specifically, the top surface of the GaN-based compound semiconductor layer is parallel to the {0001} plane of a GaN-based compound semiconductor crystal, and the side surface of the GaN-based compound semiconductor layer is parallel to the following plane of a GaN-based compound semiconductor crystal.

$\{11\bar{2}0\}$ plane

Hereinafter, such a crystal plane is expressed as {11-20} plane for the sake of convenience.

Furthermore, the following examples of crystal planes in the hexagonal system are expressed as the {hk-il} plane and {h-kil} plane, respectively, in the present specification for the sake of convenience.

$\{hk\bar{i}l\}$ plane $\{h\bar{k}il\}$ plane

In addition, the following examples of directions in the hexagonal system are expressed as the <hk-il> direction and <h-kil> direction, respectively, in the present specification for the sake of convenience.

$\{hk\bar{i}l\}$ direction $\{h\bar{k}il\}$ direction

The outline of an existing method for forming an underlayer composed of a GaN-based compound semiconductor and an existing method for manufacturing a GaN-based semiconductor light-emitting element will be described below with reference to FIGS. 9A to 9C and 10A to 10C as schematic partial sectional views of a sapphire substrate and so on.

[Step-10]

Initially, a sapphire substrate 210 of which top surface is the C-plane is loaded into an MOCVD apparatus, and therein the substrate 210 is cleaned in a hydrogen carrier gas for ten minutes at a substrate temperature of 1050° C., followed by decreasing of the substrate temperature to 500° C. Subsequently, based on MOCVD, a trimethylgallium (TMG) gas as a gallium source is supplied, with an ammonia gas as a nitrogen source being supplied, so that a low-temperature GaN buffer layer 211 having a thickness of 30 nm is grown on the surface (C-plane) of the sapphire substrate 210, followed by stop of the supply of the TMG gas. Subsequently, the substrate temperature is increased to 1020° C., and then supply of the TMG gas is restarted, so that a seed layer forming film 212A composed of undoped GaN is grown to a thickness of 2 μm on the buffer layer 211 (see FIG. 9A).

[Step-20]

Thereafter, the sapphire substrate 210 is brought out from the MOCVD apparatus, and strip mask layers 213 composed of nickel (Ni) are formed on the seed layer forming film 212A based on lift-off. The mask layers 213 extend in parallel to the <1-100> direction of the seed layer forming film 212A (see FIG. 9B). After the formation of the mask layers 213, the seed layer forming film 212A is etched by RIE employing a chlorine gas with use of the mask layers 213 as the etching mask, followed by removal of the mask layers 213 (see FIG. 9C). In this manner, strip seed layers 212 extending in the <1-100> direction can be obtained. The width direction of the seed layers 212 corresponds with the <11-20> direction, and the top surfaces of the seed layers 212 composed of undoped GaN are the C-plane. Furthermore, when the width, thickness, and formation pitch of the seed layers 212 are defined as $W_s$, T, and $W_p$, respectively, the values of these parameters are as follows: $W_s=5$ μm, $T=2$ μm, and $W_p=15$ μm.

[Step-30]

After the formation of the seed layers 212, the sapphire substrate 210 is loaded into the MOCVD apparatus again, where underlayers 215 composed of GaN are ELO-grown at a substrate temperature of 1050° C. under a pressure of $1 \times 10^4$ Pa. Specifically, the crystal growth of the underlayers 215 composed of GaN is started from the top surfaces and side surfaces of the seed layers 212 (see FIGS. 10A and 10B), so that eventually the spaces between the seed layers 212 are filled with the underlayers 215 to some extent (see FIG. 10C).

[Step-40]

Thereafter, on low dislocation density parts of the underlayers 215, GaN-based semiconductor light-emitting elements such as lasers or light emitting diodes (LEDs) are formed. Specifically, supply of a monosilane ($SiH_4$) gas as a silicon source is started at a substrate temperature of 1020° C. under an atmospheric pressure, so that an n-type first GaN-based compound semiconductor layer composed of Si-doped GaN (GaN: Si) and having a thickness of 3 μm is grown on the underlayers 215. The doping concentration is about $5 \times 10^{18}/cm^3$.

Thereafter, the supply of the TMG gas and the $SiH_4$ gas is stopped, and the substrate temperature is decreased to 750° C. Subsequently, by employing a triethylgallium (TEG) gas and a trimethylindium (TMI) gas and supplying these gasses through valve switching, an active layer composed of InGaN and GaN and having a multiple quantum well structure is grown.

For example, in order to form a laser of which emission wavelength is 400 nm, a multiple quantum well structure (including e.g. two well layers) composed of InGaN and GaN layers (thicknesses thereof are 2.5 nm and 7.5 nm, respectively) and having an In-content of about 9% is formed. In order to form a blue LED of which emission wavelength is 460 nm±10 nm, a multiple quantum well structure (including e.g. fifteen well layers) composed of InGaN and GaN layers (thicknesses thereof are 2.5 nm and 7.5 mn, respectively) and having an In-content of about 15% is formed. In order to form a green LED of which emission wavelength is 520 nm±10 nm, a multiple quantum well structure (including e.g. nine well layers) composed of InGaN and GaN layers (thicknesses thereof are 2.5 nm and 15 run, respectively) and having an In-content of about 23% is formed.

After the formation of the active layer has been completed, the supply of the TEG gas and TMI gas is stopped, and the carrier gas is switched from nitrogen to hydrogen. Furthermore, the substrate temperature is increased to 850° C., and supply of the TMG gas and a bis(cyclopentadienyl)magnesium ($Cp_2Mg$) gas is started, so that a second GaN-based compound semiconductor layer composed of Mg-doped GaN (GaN:Mg) is grown to a thickness of 100 nm on the active layer. The doping concentration is about $5 \times 10^{19}/cm^3$. Thereafter, a contact layer composed of InGaN is grown. Subsequently, the supply of the TMG gas and $Cp_2Mg$ gas is stopped and the substrate temperature is decreased to a room temperature to thereby complete the crystal growth.

[Step-50]

After the crystal growth has been thus completed, the sapphire substrate 210 is subjected to annealing treatment in a nitrogen gas atmosphere at about 800° C. for ten minutes, to thereby activate the p-type impurity (p-type dopant).

[Step-60]

Thereafter, for example, in a similar manner to a normal wafer process and dicing step, the substrate is subjected to a photolithography step, etching step, step of forming p-electrodes and n-electrodes by metal evaporation, and step of dicing into chips. Furthermore, resin molding and packaging are carried out, so that various light emitting diodes such as round-type diodes and surface-mount-type diodes can be manufactured.

In the above-described existing method for forming an underlayer composed of a GaN-based compound semiconductor and method for manufacturing a GaN-based semiconductor light-emitting element, when the underlayers 215 are ELO-grown in [Step-30], gaps are generated between the underlayers 215 and the surface of the sapphire substrate 210 (see FIG. 10C) because it is difficult to grow the underlayers 215 on the sapphire substrate 210 of which surface is the C-plane.

This results in a problem that the underlayers 215 are readily removed from the sapphire substrate 210. Furthermore, in the case of a GaN-based semiconductor light-emitting element that has a structure in which light emitted from an active layer is extracted through a sapphire substrate, the following problem is also caused. Specifically, as the path for light emitted from the GaN-based semiconductor light-emitting element, two kinds of light paths problematically exist: the path via the underlayer 215 and the sapphire substrate 210; and the path via the underlayer 215, a gap, and the sapphire substrate 210.

SUMMARY

There is a need to provide such a method for forming an underlayer composed of a GaN-based compound semiconductor as to offer no gap between the underlayer and the surface of a sapphire substrate when the underlayer is epitaxially grown on the surface of the sapphire substrate. Furthermore, there is another need to provide a GaN-based semiconductor light-emitting element to which the method for forming an underlayer composed of a GaN-based compound semiconductor is applied, and a method for manufacturing the same.

To address the above-described, a method for forming an underlayer composed of a GaN-based compound semiconductor according to an embodiment includes the steps of:

(A) forming a strip seed layer composed of a GaN-based compound semiconductor on a surface of a sapphire substrate;

(B) forming a crystal growth promoting layer composed of a GaN-based compound semiconductor on a top surface and both side surfaces of the seed layer, and on an exposed surface of the sapphire substrate; and (C) epitaxially growing an underlayer composed of a GaN-based compound semiconductor from a part of the crystal growth promoting layer on the top surface of the seed layer, a part of the crystal growth promoting layer on both the side surfaces of the seed layer, and a part of the crystal growth promoting layer on the exposed surface of the sapphire substrate.

A method for manufacturing a GaN-based semiconductor light-emitting element according to an embodiment includes at least the steps of:

(A) forming a strip seed layer composed of a GaN-based compound semiconductor on a surface of a sapphire substrate;

(B) forming a crystal growth promoting layer composed of a GaN-based compound semiconductor on a top surface and both side surfaces of the seed layer, and on an exposed surface of the sapphire substrate; and (C) epitaxially growing an underlayer composed of a GaN-based compound semiconductor from a part of the crystal growth promoting layer on the top surface of the seed layer, a part of the crystal growth promoting layer on both the side surfaces of the seed layer, and a part of the crystal growth promoting layer on the exposed surface of the sapphire substrate.

It is preferable that the method for manufacturing a GaN-based semiconductor light-emitting element according to the first embodiment further include the step of, subsequently to the step (C), sequentially forming over the underlayer a first GaN-based compound semiconductor layer of a first conductivity type, an active layer composed of a GaN-based compound semiconductor, and a second GaN-based compound semiconductor layer of a second conductivity type.

The method for forming an underlayer according to the first embodiment and the method for manufacturing a GaN-based semiconductor light-emitting element according to an embodiment of the invention may further include the steps of, subsequently to the step (C), forming on the underlayer a mask layer through which a part of the underlayer above the seed layer is exposed, and then selectively removing the underlayer, and removing the mask layer, and then epitaxially growing a second underlayer on the underlayer. Furthermore, this step may be repeated plural times. Specifically, for example, the methods according to an embodiment may further include the steps of, subsequently to the epitaxial growth of the second underlayer, forming on the second underlayer a second mask layer through which a part of the second underlayer above the seed layer is exposed, and then selectively removing the second underlayer, and removing the second mask layer, and then epitaxially growing a third underlayer on the second underlayer.

Alternatively, the methods according to an embodiment may further include the steps of, subsequently to the step (C), forming a mask layer that covers a part of the underlayer above the seed layer, and epitaxially growing a second underlayer in a lateral direction from a part of the underlayer not covered by the mask layer.

In the methods according to an embodiment, the surface of the sapphire substrate may be the C-plane. In this case, the top surface of the seed layer is the C-plane. Alternatively, the surface of the sapphire substrate may be the R-plane. In this case, the top surface of the seed layer is the A-plane.

To address the above-described need, a GaN-based semiconductor light-emitting element according to an embodiment includes:

(a) a strip seed layer configured to be formed on a surface of a sapphire substrate and be composed of a GaN-based compound semiconductor;

(b) a crystal growth promoting layer configured to be composed of a GaN-based compound semiconductor and be formed on a top surface and both side surfaces of the seed layer, and on an exposed surface of the sapphire substrate;

(c) an underlayer configured to be composed of a GaN-based compound semiconductor and be formed on a part of the crystal growth promoting layer on the top surface of the seed layer, a part of the crystal growth promoting layer on both the side surfaces of the seed layer, and a part of the crystal growth promoting layer on the exposed surface of the sapphire substrate; and (d) a first GaN-based compound semiconductor layer of a first conductivity type, an active layer composed of a GaN-based compound semiconductor, and a second GaN-based compound semiconductor layer of a second conductivity type configured to be sequentially formed over the underlayer.

A method for forming an underlayer composed of a GaN-based compound semiconductor according to another embodiment of the present invention (hereinafter, abbreviated as a method for forming an underlayer according to the second embodiment of the invention) includes the steps of:

(A) forming on a surface of an R-plane sapphire substrate a strip seed layer that is composed of a GaN-based compound semiconductor and has a crystal growth inhibiting substance on a top surface of the seed layer; and (B) epitaxially growing an underlayer composed of a GaN-based compound semiconductor from a top surface and both side surfaces of the seed layer, and from an exposed surface of the sapphire substrate.

A method for manufacturing a GaN-based semiconductor light-emitting element according to an embodiment of the invention includes at least the steps of:

(A) forming on a surface of an R-plane sapphire substrate a strip seed layer that is composed of a GaN-based compound semiconductor and has a crystal growth inhibiting substance on a top surface of the seed layer; and (B) epitaxially growing an underlayer composed of a GaN-based compound semiconductor from a top surface and both side surfaces of the seed layer, and from an exposed surface of the sapphire substrate.

It is preferable that the method for manufacturing a GaN-based semiconductor light-emitting element according to an embodiment further include the step of, subsequently to the step (B), sequentially forming over the underlayer a first GaN-based compound semiconductor layer of a first conductivity type, an active layer composed of a GaN-based compound semiconductor, and a second GaN-based compound semiconductor layer of a second conductivity type.

In the method for forming an underlayer according to an embodiment and the method for manufacturing a GaN-based semiconductor light-emitting element according to an embodiment, it is preferable that the step (A) include the sub-steps of:

(A-1) forming a seed layer forming film composed of a GaN-based compound semiconductor on the surface of the R-plane sapphire substrate;

(A-2) sequentially forming a crystal growth inhibiting substance layer and a mask layer on the seed layer forming film;

(A-3) selectively removing the mask layer and the crystal growth inhibiting substance layer to thereby selectively expose the seed layer forming film;

(A-4) removing the exposed seed layer forming film to thereby form the strip seed layer; and (A-5) removing the mask layer and the crystal growth inhibiting substance layer on the seed layer so that the crystal growth inhibiting substance is left on the top surface of the seed layer.

The methods according to an embodiment may further include the steps of, subsequently to the step (B), forming on the underlayer a second mask layer through which a part of the underlayer above the seed layer is exposed, and then selectively removing the underlayer, and removing the second mask layer, and then epitaxially growing a second underlayer on the underlayer. Furthermore, this step may be repeated plural times. Specifically, for example, the methods according to the second embodiment of the invention may further include the steps of, subsequently to the epitaxial growth of the second underlayer, forming on the second underlayer a third mask layer through which a part of the second underlayer above the seed layer is exposed, and then selectively removing the second underlayer, and removing the third mask layer, and then epitaxially growing a third underlayer on the second underlayer.

Alternatively, the methods according to an embodiment may further include the steps of, subsequently to the step (B), forming a second mask layer that covers a part of the underlayer above the seed layer, and epitaxially growing a second underlayer in a lateral direction from a part of the underlayer not covered by the second mask layer.

A GaN-based semiconductor light-emitting element according to an embodiment includes:

(a) a strip seed layer configured to be formed on a surface of an R-plane sapphire substrate and be composed of a GaN-based compound semiconductor, the seed layer having a crystal growth inhibiting substance on a top surface of the seed layer;

(b) an underlayer configured to be composed of a GaN-based compound semiconductor and be formed on a top surface and both side surfaces of the seed layer, and on an exposed surface of the sapphire substrate; and (c) a first GaN-based compound semiconductor layer of a first conductivity type, an active layer composed of a GaN-based compound semiconductor, and a second GaN-based compound semiconductor layer of a second conductivity type configured to be sequentially formed over the underlayer.

In the methods according to an embodiment and the GaN-based semiconductor light-emitting element according to an embodiment, the crystal growth inhibiting substance may be a refractory metal, and specifically may be titanium (Ti) or tungsten (W).

In the methods for forming an underlayer, the GaN-based semiconductor light-emitting elements, and the methods for manufacturing the same according to an embodiment, when the width, thickness, and formation pitch of the seed layer are defined as $W_s$, T, and $W_p$, respectively, it is preferable that Equation (1) be satisfied, and it is more preferable that Equation (1') be satisfied.

$$T \geq (W_p - W_s)/2 \qquad (1)$$

$$T \geq (W_p - W_s)/4 \qquad (1')$$

Satisfying Equation (1) or (1') can suppress the occurrence of defects such as dislocations in the relevant parts of the underlayer more surely at the time of epitaxial growth of the underlayer on the surface of the sapphire substrate.

In the method for forming an underlayer, the GaN-based semiconductor light-emitting element, and the method for manufacturing the same according to an embodiment, the strip seed layer composed of a GaN-based compound semiconductor can be obtained by forming a GaN-based compound semiconductor layer (e.g., a GaN layer of which top surface is the C-plane or A-plane) on the C-plane or R-plane of a sapphire substrate, and then patterning this GaN-based compound semiconductor layer by lithography and etching. When a seed layer of which top surface is the C-plane is formed on the C-plane of a sapphire substrate, the extension direction of the seed layer is set to the <1-100> direction. In this case, the width direction of the seed layer corresponds with the <11-20> direction. When a seed layer of which top surface is the A-plane is formed on the R-plane of a sapphire substrate, the extension direction of the seed layer is set to the <1-100> direction. In this case, the width direction of the seed layer corresponds with the <0001> direction.

In the method for forming an underlayer, the GaN-based semiconductor light-emitting element, and the method for manufacturing the same according to the second embodiment of the invention, the strip seed layer composed of a GaN-based compound semiconductor can be obtained by forming a GaN-based compound semiconductor layer (e.g., a GaN layer of which top surface is the A-plane) on the R-plane of a sapphire substrate, and then pattering this GaN-based compound semiconductor layer by lithography and etching. When a seed layer of which top surface is the A-plane is formed on the R-plane of a sapphire substrate, the extension direction of the seed layer is set to the <1-100> direction. In this case, the width direction of the seed layer corresponds with the <0001> direction.

In the methods according to an embodiment including the above-described various preferred modes and configurations, it is preferable that the epitaxial growth of the underlayer and the second underlayer be carried out by use of metal organic chemical vapor deposition (MOCVD) employing an organic gallium source gas and a nitrogen source gas. Examples of the method for forming a GaN-based compound semiconductor layer to serve as the seed layer include MOCVD, molecular beam epitaxy (MBE), and hydride vapor-phase epitaxy, in which halogens contribute to transport and reaction. Furthermore, examples of the method for forming a first GaN-based compound semiconductor layer, an active layer, and a second GaN-based compound semiconductor layer also include MOCVD, MBE, and hydride vapor-phase epitaxy, in which halogens contribute to transport and reaction.

As the organic gallium source gas in MOCVD, a trimethylgallium (TMG) gas and a triethylgallium (TEG) gas can be cited. As the nitrogen source gas, an ammonia gas and a hydrazine gas can be cited. As the combination of the first conductivity type and second conductivity type, the combination of the n-type and p-type or the combination of the p-type and n-type is available. When an n-type GaN-based compound semiconductor layer is formed, e.g. silicon (Si) is added as an n-type impurity. When a p-type GaN-based compound semiconductor layer is formed, e.g. magnesium (Mg) is added as a p-type impurity. If aluminum (Al) and indium (In) are contained in a GaN-based compound semiconductor layer as its constituent atoms, a trimethylaluminum (TMA) gas is available as an Al source, and a trimethylindium (TMI) gas is available as an In source. Furthermore, a monosilane ($SiH_4$) gas is available as an Si source, and a cyclopentadienyl-magnesium gas, methylcyclopentadienyl-magnesium gas, and bis(cyclopentadienyl)magnesium ($Cp_2Mg$) gas are available as an Mg source. Examples of the n-type impurity (n-type dopant) include, besides Si, Ge, Se, Sn, C, and Ti. Examples of the p-type impurity (p-type dopant) include, besides Mg, Zn, Cd, Be, Ca, Ba, and O.

In the methods for forming an underlayer, the GaN-based semiconductor light-emitting elements, and the methods for manufacturing the same according to an embodiment including the above-described various preferred modes and configurations, examples of the seed layer, underlayer, second underlayer, first GaN-based compound semiconductor layer, active layer, and second GaN-based compound semiconductor layer include a GaN layer, AlGaN layer, InGaN layer, AlInGaN layer, AlN layer, InN layer, BN layer, and GaN-based compound semiconductor layer obtained by adding boron (B) atoms or thallium (Tl) atoms to any of these compound semiconductor layers.

The active layer composed of a GaN-based compound semiconductor may be formed of one GaN-based compound semiconductor layer, and may have a single quantum well structure (QW structure) or multiple quantum well structure (MQW structure). The active layer can be configured to contain indium atoms, and specifically have a composition expressed as $Al_xGa_{1-x-y}In_yN$ ($x \geq 0$, $y > 0$, $0 < x+y \leq 1$).

The A-plane, C-plane, M-plane, R-plane, and S-plane in the hexagonal system are shown in FIGS. 11A, 11B, and 11C. In the present specification and the scope of claims, the C-plane and R-plane of a sapphire substrate and the C-plane and A-plane as the top surfaces of underlayers and GaN-based compound semiconductor layers encompass also planes inclined relative to these planes by an offset angle in the range of ±5 degrees.

In the method for manufacturing a GaN-based semiconductor light-emitting element according to an embodiment and the method for manufacturing a GaN-based semiconductor light-emitting element according to an embodiment, depending on the case, the seed layer and the underlayer may be separated from the surface of the sapphire substrate after formation of the second GaN-based compound semiconductor layer. Furthermore, the seed layer and the underlayer may be removed to thereby expose the first GaN-based compound semiconductor layer. If the seed layer and the underlayer are removed, a first electrode may be formed on the exposed first GaN-based compound semiconductor layer. As a method for separating the seed layer and the underlayer from the surface of the sapphire substrate, a method is available in which the interface between the sapphire substrate and the seed layer and the underlayer is irradiated with laser light (e.g., KrF excimer laser light having a wavelength of 248 nm) via the sapphire substrate. Furthermore, as a method for removing the seed layer and the underlayer, the following methods are available: a method of etching the seed layer and the underlayer, method of carrying out polishing, and method including a combination of etching and polishing.

In an embodiment, a second electrode is provided on the second GaN-based compound semiconductor layer. If the second conductivity type is the p-type, it is preferable that the second electrode have a single layer structure or multilayer structure including at least one metal selected from the group consisting of palladium (Pd), platinum (Pt), nickel (Ni), aluminum (Al), titanium (Ti), gold (Au), and silver (Ag). Alternatively, a transparent conductive material such as indium tin oxide (ITO) can also be used. Of these materials, silver (Ag), Ag/Ni, or Ag/Ni/Pt, which allows light to be reflected with high efficiency, is preferably used. Furthermore, a first electrode electrically coupled to the first GaN-based compound semiconductor layer is also provided. If the first conductivity type is the n-type, it is desirable that the first electrode have a single layer structure or multilayer structure including at least one metal selected from the group consisting of gold (Au), silver (Ag), palladium (Pd), aluminum (Al), titanium (Ti), tungsten (W), copper (Cu), zinc (Zn), tin (Sn), and indium (In). As examples of the structure, Ti/Au, Ti/Al, and Ti/Pt/Au can be cited. The first and second electrodes can be formed by e.g. physical vapor deposition (PVD) such as vacuum evaporation or sputtering. For provision of the first electrode, the second GaN-based compound semiconductor layer and the active layer are partially removed to thereby expose a part of the first GaN-based compound semiconductor layer, so that the first electrode is provided on the exposed part of the first GaN-based compound semiconductor layer. If the seed layer and the underlayer are removed, the first electrode can be provided on the exposed first GaN-based compound semiconductor layer.

A pad electrode may be provided on the first and second electrodes for electrical coupling to an external electrode or circuit. It is desirable that the pad electrode have a single layer structure or multilayer structure including at least one metal selected from the group consisting of titanium (Ti), aluminum (Al), platinum (Pt), gold (Au), and nickel (Ni). Alternatively, the pad electrode may have a multilayer structure such as a Ti/Pt/Au multilayer structure or Ti/Au multilayer structure.

As the light-emitting element according to an embodiment, a light emitting diode (LED) and a semiconductor laser (LD) can be cited. As long as the multilayer structure of GaN-based compound semiconductor layers has a light emitting diode structure or laser structure, there is no particular limitation on the kind and composition of the GaN-based compound semiconductors and also on the structure and configuration of the GaN-based compound semiconductor layers. In an embodiment including the above-described preferred modes and configurations, assembly of a GaN-based semiconductor light-emitting element may have a face-up structure or flip-chip structure.

In the method for forming an underlayer, the GaN-based semiconductor light-emitting element, and the method for manufacturing the same according to an embodiment, a crystal growth promoting layer composed of a GaN-based compound semiconductor is formed on the top surface and both the side surfaces of a seed layer, and on the exposed surface of a sapphire substrate. Therefore, an underlayer is epitaxially grown not only from the top surface and both the side surfaces of the seed layer but also from the exposed surface of the sapphire substrate. Therefore, a high quality GaN-based semiconductor light-emitting element can be manufactured with no gap being formed above the part of the sapphire substrate between the seed layers. In the method for forming an underlayer, the GaN-based semiconductor light-emitting element, and the method for manufacturing the same according to the second embodiment of the invention, a crystal growth inhibiting substance exists on the top surface (A-plane) of a seed layer. Thus, in epitaxial growth of an underlayer, the underlayer is epitaxially grown not only from the top surface and both the side surfaces of the seed layer but also from the exposed surface of a sapphire substrate. Therefore, a high quality GaN-based semiconductor light-emitting element can be manufactured with no gap being formed above the part of the sapphire substrate between the seed layers.

Additional features and advantages are described herein, and will be apparent from, the following Detailed Description and the figures.

DETAILED DESCRIPTION

Figure 1A:
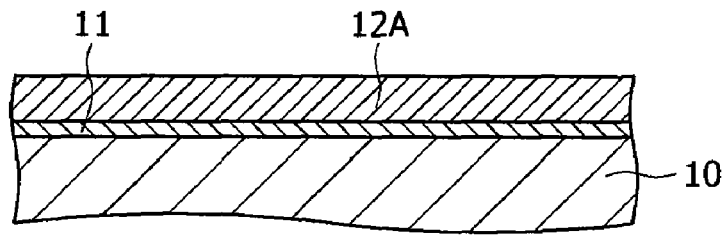
FIGS. 1A to 1E are schematic partial sectional views of a sapphire substrate and so on, for explaining a method for forming an underlayer composed of a GaN-based compound semiconductor and a method for manufacturing a GaN-based semiconductor light-emitting element of a an embodiment.
Figure 1B:
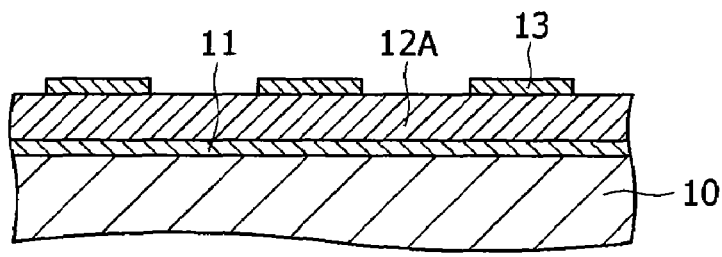
Figure 1C:
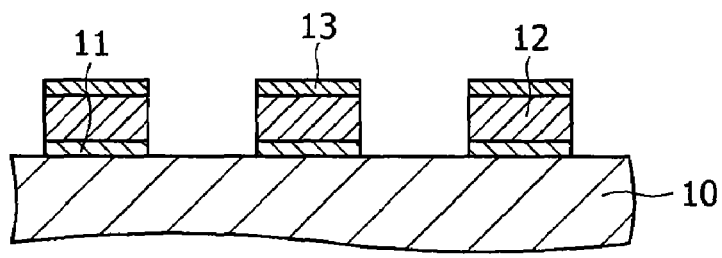
Figure 1D:
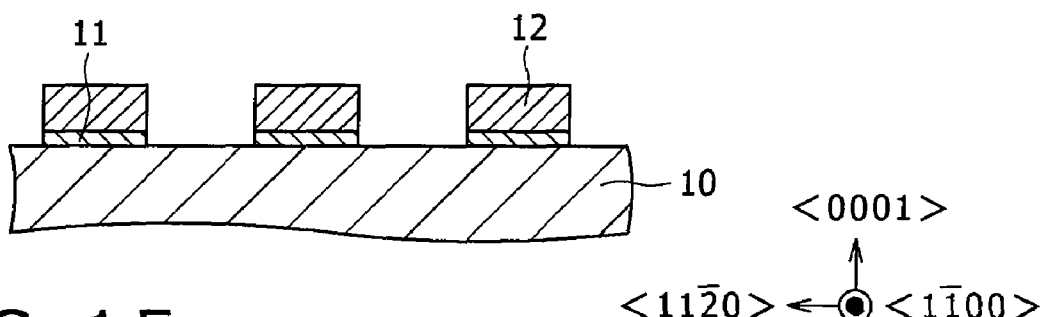

Embodiments will be described below with reference to the accompanying drawings.

A first embodiment relates to the method for forming an underlayer, the GaN-based semiconductor light-emitting element, and the method for manufacturing the same according to the first embodiment of the invention. A method for forming an underlayer and a method for manufacturing a GaN-based semiconductor light-emitting element of the first embodiment will be described below with reference to FIGS. 1A to 1E and 2A to 2C as schematic partial sectional views of a sapphire substrate and so on.

[Step-100]

Initially, strip seed layers 12 composed of a GaN-based compound semiconductor are formed on the surface of a C-plane sapphire substrate 10. Specifically, the sapphire substrate 10 of which top surface is the C-plane is loaded into a MOCVD apparatus, and therein the substrate 10 is cleaned in a hydrogen carrier gas for ten minutes at a substrate temperature of 1050° C., followed by decreasing of the substrate temperature to 500° C. Subsequently, based on MOCVD, a TMG gas as a gallium source is supplied, with an ammonia gas as a nitrogen source being supplied, so that a low-temperature GaN buffer layer 11 having a thickness of 30 nm is grown on the surface (C-plane) of the sapphire substrate 10, followed by stop of the supply of the TMG gas. Subsequently, the substrate temperature is increased to 1020° C., and then supply of the TMG gas is restarted, so that a seed layer forming film 12A that is composed of undoped GaN and having the C-plane as its top surface is grown to a thickness T of 6 µm on the buffer layer 11 (see FIG. 1A). The thickness of the seed layer forming film 12A is sufficiently larger than that of the seed layer forming film 212A in the above-described existing technique.

Thereafter, the sapphire substrate 10 is brought out from the MOCVD apparatus, and strip mask layers 13 composed of nickel (Ni) are formed on the seed layer forming film 12A based on lift-off. The mask layers 13 extend in parallel to the <1-100> direction of the seed layer forming film 12A (see FIG. 1B). After the formation of the mask layers 13, the seed layer forming film 12A is etched by RIE employing a chlorine gas with use of the mask layers 13 as the etching mask (see FIG. 1C), followed by removal of the mask layers 13 (see FIG. 1D). In this manner, the strip seed layers 12 extending in the <1-100> direction can be obtained. The width direction of the seed layers 12 corresponds with the <11-20> direction, and the top surfaces of the seed layers 12 composed of undoped GaN are the C-plane. Furthermore, when the width, thickness, and formation pitch of the seed layers 12 are defined as $W_s$, T, and $W_p$, respectively, the values of these parameters are as follows: $W_s$=5 µm, T=6 µm, and $W_p$=15 µm (see FIG. 2B). Therefore, the above-described Equations (1) and (1') are satisfied. This condition can suppress the occurrence of defects such as dislocations in the relevant parts of an underlayer 15 at the time of epitaxial growth of the underlayer 15 on the surface of the sapphire substrate 10. In contrast, the seed layers 212 in the above-described existing technique do not satisfy Equations (1) and (1').

[Step-110]

Figure 1E:
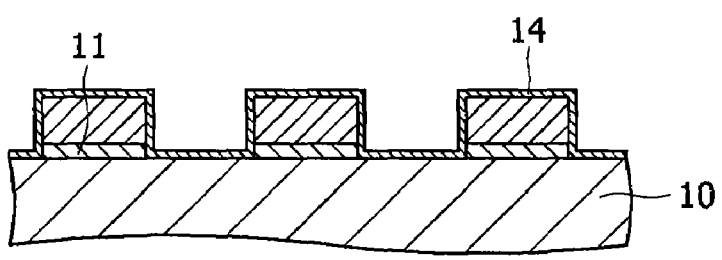
Figure 2A:
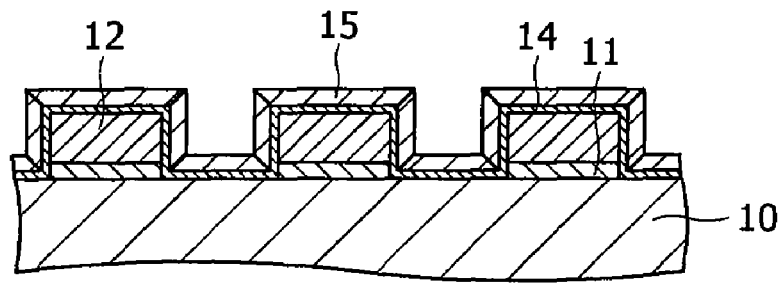
FIGS. 2A to 2C are schematic partial sectional views of the sapphire substrate and so on subsequent to FIG. 1E, for explaining the method for forming an underlayer composed of a GaN-based compound semiconductor and the method for manufacturing a GaN-based semiconductor light-emitting element of an embodiment.
Figure 2B:
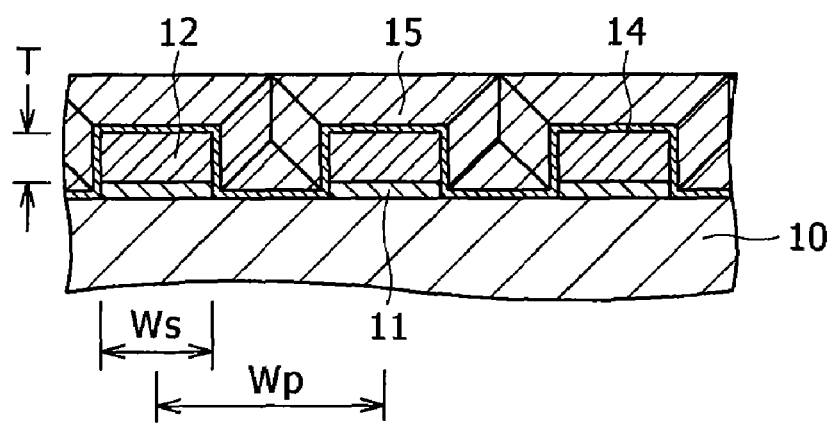
Figure 2C:
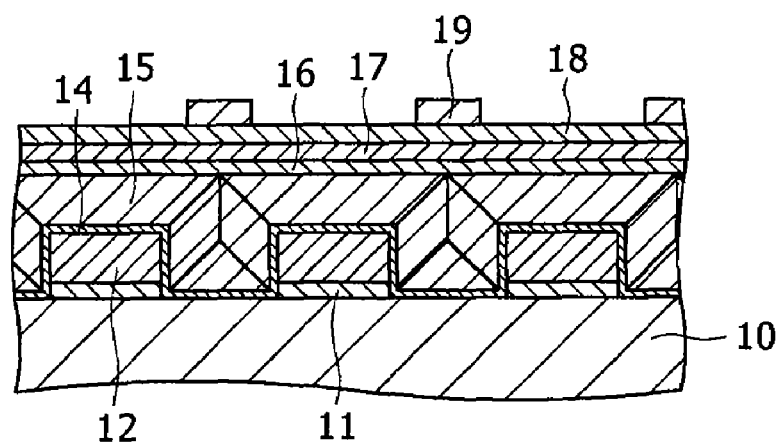

After the formation of the seed layers 12, a crystal growth promoting layer 14 composed of a GaN-based compound semiconductor (specifically, undoped GaN) is formed on the top surfaces and both the side surfaces of the seed layers 12, and on the exposed surfaces of the sapphire substrate 10 (see FIG. 1E). Specifically, the sapphire substrate 10 is loaded in the MOCVD apparatus again, and therein the crystal growth promoting layer 14 composed of undoped GaN and having a thickness of 30 nm is formed on the top surfaces and both the side surfaces of the seed layers 12, and on the exposed surface of the sapphire substrate 10, at a substrate temperature of 500° C. under an atmospheric pressure.

[Step-120]

Subsequently, the underlayer 15 composed of a GaN-based compound semiconductor is epitaxially grown from the parts of the crystal growth promoting layer 14 on the top surfaces of the seed layers 12, the parts of the crystal growth promoting layer 14 on both the side surfaces of the seed layers 12, and the parts of the crystal growth promoting layer 14 on the exposed surfaces of the sapphire substrate 10. Specifically, the underlayer 15 composed of undoped GaN is epitaxially grown at a substrate temperature of 1050° C. under an atmospheric pressure from the parts of the crystal growth promoting layer 14 on the top surfaces of the seed layers 12, the parts of the crystal growth promoting layer 14 on both the side surfaces of the seed layers 12, and the parts of the crystal growth promoting layer 14 on the exposed surfaces of the sapphire substrate 10, so that the spaces between the seed layers 12 are filled with the underlayer 15 (see FIGS. 2A and 2B). Because the crystal growth promoting layer 14 composed of a GaN-based compound semiconductor is formed on the top surfaces and both the side surfaces of the seed layers 12, and on the exposed surfaces of the sapphire substrate 10, no gap is formed above the sapphire substrate 10. The top surface of the underlayer 15 is the C-plane.

[Step-130]

Subsequently, over the underlayer 15, a first GaN-based compound semiconductor layer 16 of a first conductivity type, an active layer 17 composed of a GaN-based compound semiconductor, and a second GaN-based compound semiconductor layer 18 of a second conductivity type are sequentially formed. The top surfaces of the respective layers are also the C-plane. Specifically, in a similar manner to [Step-40] to [Step-60] described in "Description of the Related Art", GaN-based semiconductor light-emitting elements such as lasers or light emitting diodes (LEDs) are formed over low dislocation density parts of the underlayer 15. More specifically, supply of a monosilane ($SiH_4$) gas as a silicon source is started at a substrate temperature of 1020° C. under an atmospheric pressure, so that the n-type first GaN-based compound semiconductor layer 16 composed of Si-doped GaN (GaN:Si) and having a thickness of 3 µm is grown on the underlayer 15. The doping concentration is about $5 \times 10^{18}$/$cm^3$.

Thereafter, the supply of the TMG gas and $SiH_4$ gas is stopped, and the substrate temperature is decreased to 750° C.

Subsequently, by employing a TEG gas and TMI gas and supplying these gasses through valve switching, the active layer 17 composed of InGaN and GaN and having a multiple quantum well structure is grown.

After the formation of the active layer 17 has been completed, the supply of the TEG gas and TMI gas is stopped, and the carrier gas is switched from nitrogen to hydrogen. Furthermore, the substrate temperature is increased to 850° C., and supply of the TMG gas and a $Cp_2Mg$ gas is started, so that the second GaN-based compound semiconductor layer 18 composed of Mg-doped GaN (GaN:Mg) is grown to a thickness of 100 nm on the active layer 17. The doping concentration is about $5 \times 10^{19}/cm^3$. Thereafter, a contact layer (not shown) composed of InGaN is grown. Subsequently, the supply of the TMG gas and $Cp_2Mg$ gas is stopped and the substrate temperature is decreased to a room temperature to thereby complete the crystal growth. The contact layer may be doped with a p-type dopant (e.g., Mg), or alternatively be undoped.

After the crystal growth has been thus completed, the sapphire substrate 10 is subjected to annealing treatment in a nitrogen gas atmosphere at about 800° C. for ten minutes, to thereby activate the p-type impurity (p-type dopant).

Thereafter, for example, in a similar manner to a normal wafer process and dicing step, the substrate is subjected to a photolithography step, etching step, step of forming second electrodes (p-electrodes) 19 by metal evaporation (see FIG. 2C), step of forming first electrodes (n-electrodes, not shown) by metal evaporation, and step of dicing into chips. Furthermore, resin molding and packaging are carried out, so that various light emitting diodes such as round-type diodes and surface-mount-type diodes can be manufactured.

That is, a GaN-based semiconductor light-emitting element including the following elements can be achieved:

(a) the strip seed layers 12 that are formed on the surface of the sapphire substrate 10 and composed of a GaN-based compound semiconductor;

(b) the crystal growth promoting layer 14 that is composed of a GaN-based compound semiconductor and formed on the top surfaces and both the side surfaces of the seed layers 12, and on the exposed surfaces of the sapphire substrate 10;

(c) the underlayer 15 that is composed of a GaN-based compound semiconductor and formed on the parts of the crystal growth promoting layer 14 on the top surfaces of the seed layers 12, the parts of the crystal growth promoting layer 14 on both the side surfaces of the seed layers 12, and the parts of the crystal growth promoting layer 14 on the exposed surfaces of the sapphire substrate 10; and (d) a first GaN-based compound semiconductor layer of a first conductivity type, an active layer composed of a GaN-based compound semiconductor, and a second GaN-based compound semiconductor layer of a second conductivity type that are sequentially formed over the underlayer 15.

Depending on the case, the seed layers 12 and the underlayer 15 may be separated from the surface of the sapphire substrate 10 after formation of the second electrodes, and the seed layers 12 and the underlayer 15 may be removed to expose the first GaN-based compound semiconductor layer. As a method for separating the seed layers 12 and the underlayer 15 from the surface of the sapphire substrate 10, a method is available in which the interface between the sapphire substrate 10 and the seed layers 12 and the underlayer 15 is irradiated with laser light (e.g., KrF excimer laser light having a wavelength of 248 nm) via the sapphire substrate 10. Furthermore, as a method for removing the seed layers 12 and the underlayer 15, the following methods are available: a method of etching the seed layers 12 and the underlayer 15, method of carrying out polishing, and method including a combination of etching and polishing.

A second embodiment is a modification of the first embodiment. There is a possibility that dislocations from the seed layers 12 propagate into the parts of the underlayer 15 above the seed layers 12 and therefore a large number of dislocations exist in the relevant parts of the underlayer 15. The second embodiment is to prevent the occurrence of such a phenomenon as much as possible. Specifically, in the second embodiment, subsequently to [Step-120] in the first embodiment, mask layers through which the parts of the underlayer 15 above the seed layers 12 are exposed (hereinafter, these mask layers will be referred to as etching mask layers 20) are formed on the underlayer 15, and then the underlayer 15 is selectively removed. Subsequently, the etching mask layers 20 are removed, followed by epitaxial growth of a second underlayer 21 on the underlayer 15.

Figure 3A:
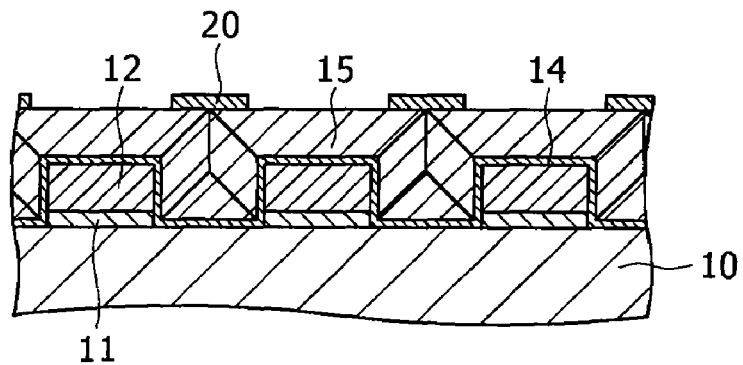
FIGS. 3A to 3D are schematic partial sectional views of a sapphire substrate and so on, for explaining a method for forming an underlayer composed of a GaN-based compound semiconductor and a method for manufacturing a GaN-based semiconductor light-emitting element of an embodiment.
Figure 3B:
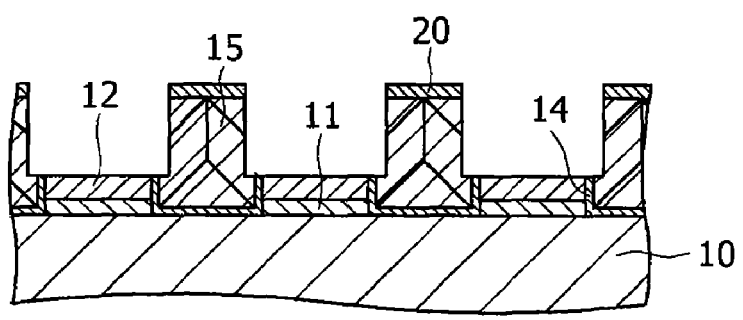
Figure 3C:
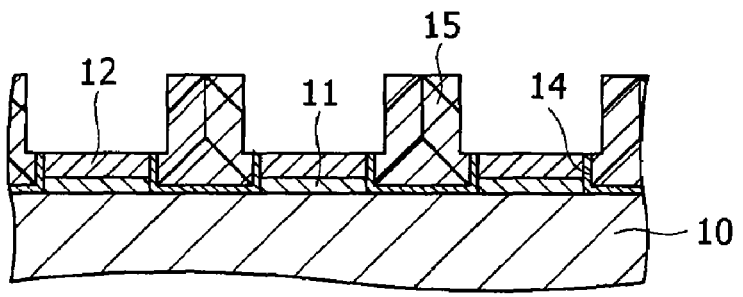
Figure 3D:
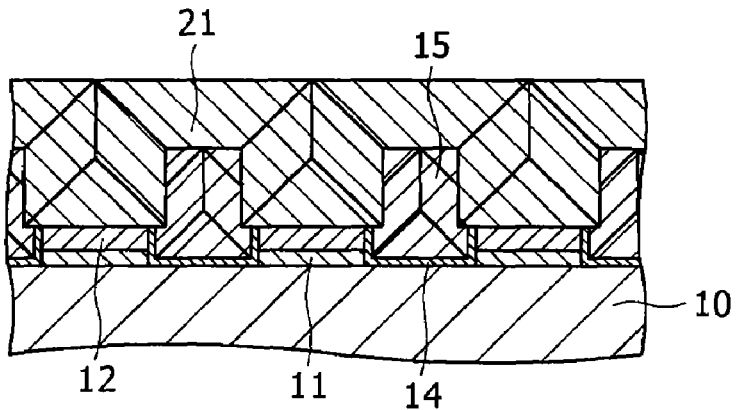

More specifically, subsequently to [Step-120] in the first embodiment, the etching mask layers 20 that are composed of Ni and expose the parts of the underlayer 15 above the seed layers 12 are formed on the underlayer 15 based on lift-off (see FIG. 3A). The length of the exposed parts of the underlayer 15 is set to 6 μm. Subsequently, the underlayer 15 is etched by RIE employing a chlorine gas. Furthermore, in the second embodiment, the seed layers 12 are partially etched (see FIG. 3B), and then the etching mask layers 20 are removed (see FIG. 3C). The total etching depth of the underlayer 15 and the seed layers 12 is set to 6 μm. Thereafter, the sapphire substrate 10 is loaded into the MOCVD apparatus again, and therein the second underlayer 21 composed of undoped GaN is epitaxially grown at a substrate temperature of 1050° C. under an atmospheric pressure from the top surfaces and both the side surfaces of the underlayers 15, and from the top surfaces of the seed layers 12, so that the spaces arising from partial etching of the underlayer 15 are filled with the second underlayer 21 (see FIG. 3D). Almost no dislocation exists in the vicinity of the top surface (C-plane) of the second underlayer 21, other than at the joint parts between the grown crystals of the second underlayer 21. The above-described steps may be executed one time, or alternatively executed plural times.

Thereafter, a step similar to [Step-130] in the first embodiment is carried out.

A third embodiment is also a modification of the first embodiment. In the second embodiment, the parts of the underlayer 15 above the seed layers 12 are selectively removed. In contrast, in the third embodiment, mask layers (hereinafter, referred to as crystal growth inhibiting mask layers 30) are formed on the parts of the underlayer 15 above the seed layers 12. Subsequently, a second underlayer 31 is epitaxially grown in a lateral direction (ELO-grown) from the parts of the underlayer 15 that are not covered by the crystal growth inhibiting mask layers 30 and hence exposed.

The crystal growth of the second underlayer 31 does not occur on the crystal growth inhibiting mask layers 30, but is started on the top surfaces of the underlayer 15, so that the second underlayer 31 extends over the crystal growth inhibiting mask layers 30. Specific examples of the crystal growth inhibiting mask layer 30 include a silicon oxide layer ($SiO_x$ layer), silicon nitride layer ($SiN_y$ layer), $Ta_2O_5$ layer, $ZrO_2$ layer, AlN layer, $Al_2O_3$ layer, multilayer structure including any of these layers (e.g., multilayer structure including a silicon oxide layer and a silicon nitride layer from the bottom), and a refractory metal layer such as a Ni layer and tungsten layer. These layers can be formed by a combination between chemical vapor deposition (CVD) or PVD such as vacuum evaporation or sputtering and any patterning technique.

Figure 4A:
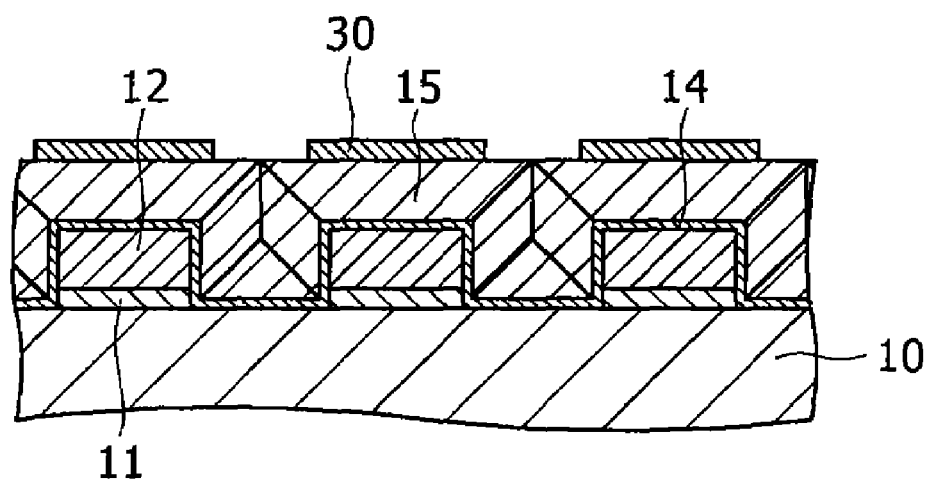
FIGS. 4A and 4B are schematic partial sectional views of a sapphire substrate and so on, for explaining a method for forming an underlayer composed of a GaN-based compound semiconductor and a method for manufacturing a GaN-based semiconductor light-emitting element of an embodiment.
Figure 4B:
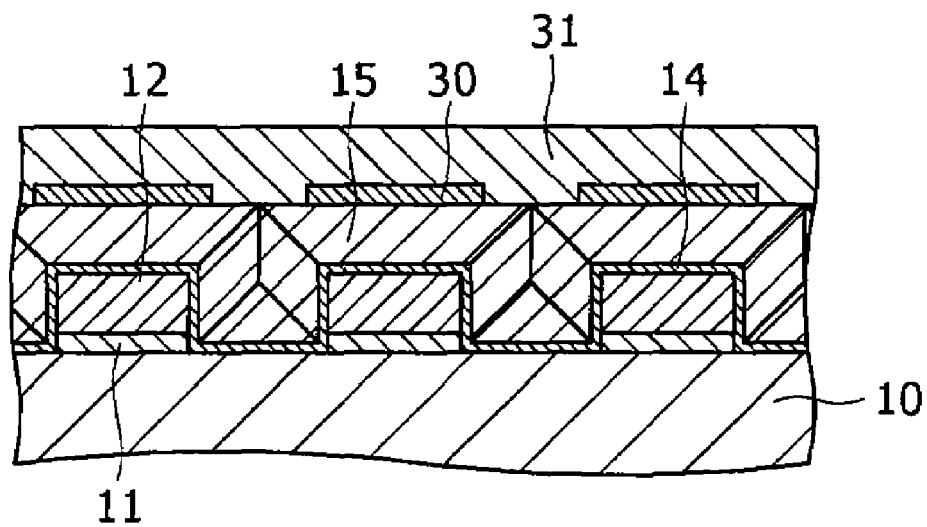

The specific step flow is as follows. Subsequently to [Step-120] in the first embodiment, the crystal growth inhibiting mask layers 30 formed of a silicon oxide layer are formed on the parts of the underlayer 15 above the seed layers 12 by sputtering and etching. The crystal growth inhibiting mask layers 30 extend in parallel to the seed layers 12 (see FIG. 4A). Subsequently, the sapphire substrate 10 is loaded into the MOCVD apparatus again, and therein the second underlayer 31 composed of undoped GaN is ELO-grown from the exposed parts of the underlayer 15 at a substrate temperature of 1050° C. under an atmospheric pressure, so that the underlayer 15 and the crystal growth inhibiting mask layers 30 are covered by the second underlayer 31 (see FIG. 4B). The second underlayer 31 includes almost no dislocation.

Thereafter, a step similar to [Step-130] in the first embodiment is carried out.

A fourth embodiment is also a modification of the first embodiment. In the first embodiment, the C-plane sapphire substrate 10 is used. In contrast, in the fourth embodiment, an R-plane sapphire substrate 10 is used. Also in the fourth embodiment, the extension direction of seed layers 12 is set to the <1-100> direction. The width direction of the seed layers 12 corresponds with the <0001> direction. The top surfaces of the seed layers 12, an underlayer 15, a first GaN-based compound semiconductor layer, an active layer, and a second GaN-based compound semiconductor layer are each the A-plane.

Furthermore, in the fourth embodiment, both the thicknesses of a buffer layer 11 and a crystal growth promoting layer 14 are set to 3 nm, and a pressure of $1 \times 10^4$ Pa is employed instead of an atmospheric pressure as the pressure at the time of epitaxial growth of the underlayer 15.

Except for the above-described conditions, a method for forming an underlayer, a GaN-based semiconductor light-emitting element, and a method for manufacturing the same of the fourth embodiment are substantially the same as those of the first embodiment. Therefore, detailed description therefor is omitted. The fourth embodiment can be applied also to the second embodiment and the third embodiment. In the fourth embodiment, the formation of the buffer layer 11 may be omitted based on the reason explained in the following description for a fifth embodiment of the invention.

The fifth embodiment relates to the method for forming an underlayer, the GaN-based semiconductor light-emitting element, and the method for manufacturing the same according to the second embodiment of the invention. A method for forming an underlayer and a method for manufacturing a GaN-based semiconductor light-emitting element of the fifth embodiment will be described below with reference to FIGS. 5A to 5D and 6A to 6C as schematic partial sectional views of a sapphire substrate and so on. If a seed layer forming film is grown directly on the C-plane of a sapphire substrate, the grown seed layer forming film is composed of a polycrystal. Therefore, using a C-plane sapphire substrate involves the need to initially form a buffer layer at a substrate temperature of 500° C. and subsequently grow seed layers thereon. In contrast, if a seed layer forming film is grown on the R-plane of a sapphire substrate, the crystal growth of the seed layer forming film is based on epitaxial growth. Therefore, in the fifth to seventh embodiments of the invention, the formation of a buffer layer is omitted. However, it should be obvious that a buffer layer may be formed also in these embodiments.

[Step-500]

Initially, strip seed layers 112 that are composed of a GaN-based compound semiconductor and have a crystal growth inhibiting substance 113A' on the top surfaces thereof are formed on the surface of an R-plane sapphire substrate 110. Specifically, the sapphire substrate 110 of which top surface is the R-plane is loaded into a MOCVD apparatus, and therein the substrate 110 is cleaned in a hydrogen carrier gas for ten minutes at a substrate temperature of 1050° C., followed by decreasing of the substrate temperature to 1020° C. Subsequently, based on MOCVD, a TMG gas as a gallium source is supplied, with an ammonia gas as a nitrogen source being supplied, so that a seed layer forming film 112A composed of undoped GaN and having a thickness T of 6 μm is grown on the surface (R-plane) of the sapphire substrate 110 (see FIG. 5A). The thickness of the seed layer forming film 112A is sufficiently larger than that of the seed layer forming film 212A in the above-described existing technique. The formation of the seed layer forming film 112A on the R-plane of the sapphire substrate 110 can be carried out without formation of a buffer layer therebetween.

After the formation of the seed layer forming film 112A, the sapphire substrate 110 is brought out from the MOCVD apparatus. Subsequently, on the seed layer forming film 112A, a crystal growth inhibiting substance layer 113A having a thickness of 10 nm and composed of Ti and a mask layer 113B having a thickness of 0.5 μm and composed of Ni are sequentially formed by sputtering. Subsequently, the mask layer 113B and the crystal growth inhibiting substance layer 113A are selectively removed by etching, so that the seed layer forming film 112A is selectively exposed (see FIG. 5B). The resultant strip mask layers 113B and crystal growth inhibiting substance layers 113A extend in parallel to the <1-100> direction of the seed layer forming film 112A (see FIG. 5D).

Figure 5A:
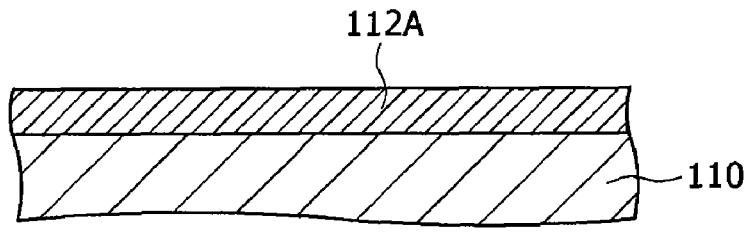
FIGS. 5A to 5D are schematic partial sectional views of a sapphire substrate and so on, for explaining a method for forming an underlayer composed of a GaN-based compound semiconductor and a method for manufacturing a GaN-based semiconductor light-emitting element of an embodiment.
Figure 5B:
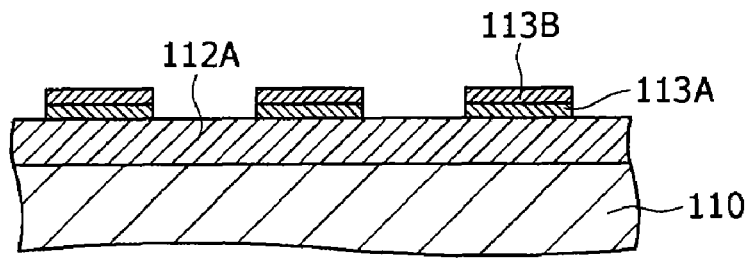
Figure 5C:
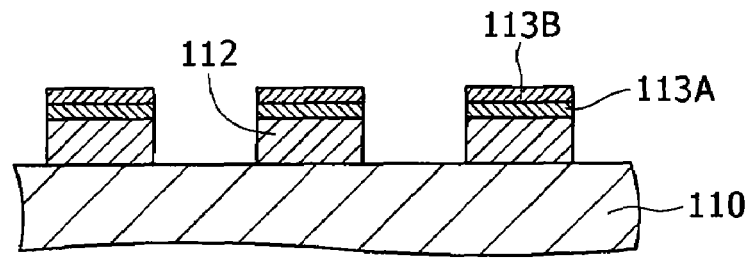
Figure 5D:
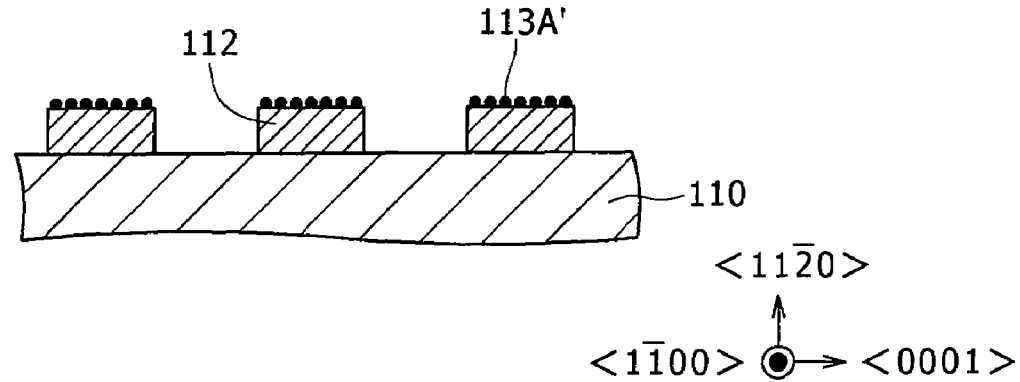

Subsequently, the seed layer forming film 112A is etched by RIE employing a chlorine gas with use of the mask layers 113B and the crystal growth inhibiting substance layers 113A having a strip shape as the etching mask to thereby form strip seed layers 112 (see FIG. 5C), followed by removal of the layers 113A and 113B on the seed layers 112 (see FIG. 5D). In this manner, the strip seed layers 112 extending in the <1-10> direction can be obtained. In addition, the crystal growth inhibiting substance 113A' (specifically a refractory metal, and more specifically Ti) is left on the top surfaces of the seed layers 112. The width direction of the seed layers 112 corresponds with the <0001> direction, and the top surfaces of the seed layers 112 composed of undoped GaN are the A-plane. Furthermore, when the width, thickness, and formation pitch of the seed layers 112 are defined as $W_s$, T, and $W_p$, respectively, the values of these parameters are as follows: $W_s$=5 μm, T=6 μm, and $W_p$=15 μm (see FIG. 6B). Therefore, the above-described Equations (1) and (1') are satisfied. This condition can suppress the occurrence of defects such as dislocations in the relevant parts of an underlayer 115 at the time of epitaxial growth of the underlayer 115 on the surface of the sapphire substrate 110.

[Step-510]

Figure 6A:
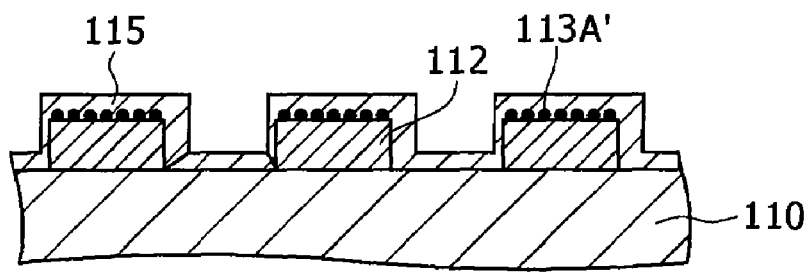
FIGS. 6A to 6C are schematic partial sectional views of the sapphire substrate and so on subsequent to FIG. 5D, for explaining the method for forming an underlayer composed of a GaN-based compound semiconductor and the method for manufacturing a GaN-based semiconductor light-emitting element of an embodiment.
Figure 6B:
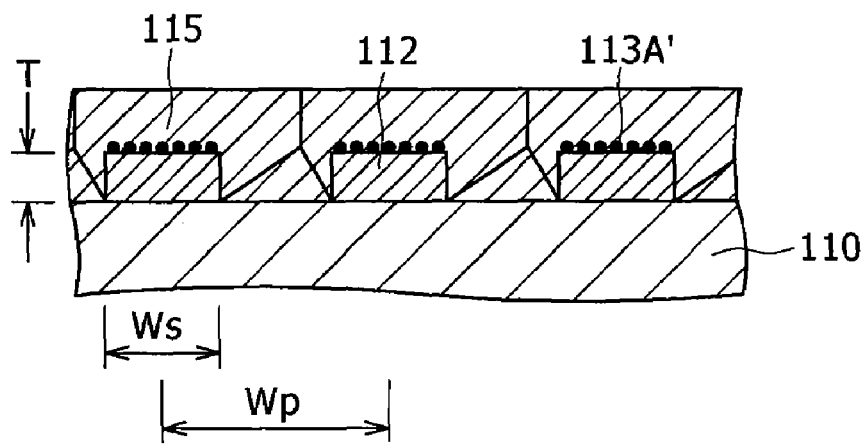

After the formation of the seed layers 112, the underlayer 115 composed of a GaN-based compound semiconductor (specifically, undoped GaN) is epitaxially grown on the top surfaces and both the side surfaces of the seed layers 112, and on the exposed surfaces of the sapphire substrate 110 (see FIGS. 6A and 6B). Specifically, the sapphire substrate 110 is loaded into the MOCVD apparatus again, and therein the underlayer 115 composed of undoped GaN is epitaxially grown on the top surfaces and both the side surfaces of the seed layers 112 and on the exposed surfaces of the sapphire substrate 110 at a substrate temperature in the range of 1000 to 1050° C. under an atmospheric pressure, so that the spaces between the seed layers 112 are filled with the underlayer 115. The top surface of the underlayer 115 is the A-plane.

Because the crystal growth inhibiting substance 113A' remains on the top surfaces of the seed layers 112, the speed of the epitaxial growth of the underlayer 115 on the top surfaces of the seed layers 112 is not very higher compared with that on the side surfaces of the seed layers 112 and that on the surface (R-plane) of the sapphire substrate 110, and hence the epitaxial growth proceeds slowly as a whole. Therefore, the epitaxial growth of the underlayer 115 surely occurs even on the R-plane of the sapphire substrate 110. Accordingly, no gap is formed above the sapphire substrate 110.

[Step-520]

Figure 6C:
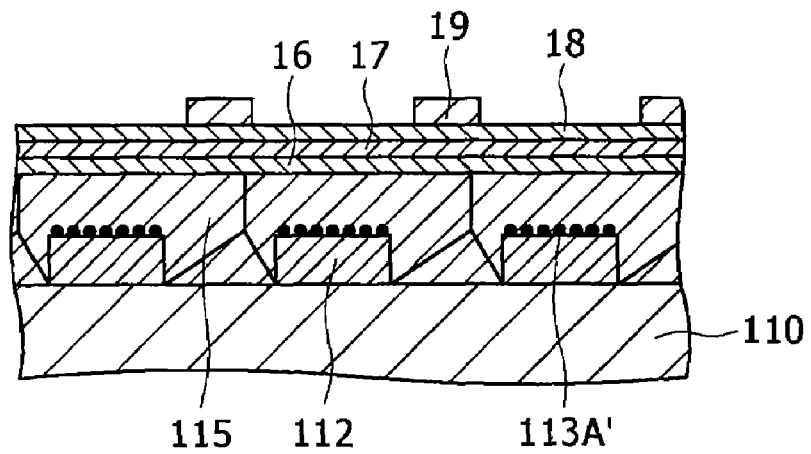

Subsequently, over the underlayer 115, a first GaN-based compound semiconductor layer 16 of a first conductivity type, an active layer 17 composed of a GaN-based compound semiconductor, and a second GaN-based compound semiconductor layer 18 of a second conductivity type are sequentially formed. The top surfaces of the respective layers are also the A-plane. Specifically, a step similar to [Step-130] in the first embodiment is carried out. The structure resulting from this step is shown in FIG. 6C.

In the above-described manner, a GaN-based semiconductor light-emitting element including the following elements can be achieved:

(a) the strip seed layers 112 that are formed on the surface of the R-plane sapphire substrate 110 and composed of a GaN-based compound semiconductor, the seed layers 112 having the crystal growth inhibiting substance 113A' on the top surfaces thereof;

(b) the underlayer 115 that is composed of a GaN-based compound semiconductor and formed on the top surfaces and both the side surfaces of the seed layers 112, and on the exposed surfaces of the sapphire substrate 110; and (c) a first GaN-based compound semiconductor layer of a first conductivity type, an active layer composed of a GaN-based compound semiconductor, and a second GaN-based compound semiconductor layer of a second conductivity type that are sequentially formed over the underlayer 115.

Depending on the case, similarly to the first embodiment, the seed layers 112 and the underlayer 115 may be separated from the surface of the sapphire substrate 110 after formation of the second electrodes, and the seed layers 112 and the underlayer 115 may be removed to expose the first GaN-based compound semiconductor layer.

A sixth embodiment is a modification of the fifth embodiment. There is a possibility that dislocations from the seed layers 112 propagate into the parts of the underlayer 115 above the seed layers 112 and therefore a large number of dislocations exist in the relevant parts of the underlayer 115. The sixth embodiment is to prevent the occurrence of such a phenomenon as much as possible. Specifically, in the sixth embodiment, subsequently to [Step-510] in the fifth embodiment, mask layers through which the parts of the underlayer 115 above the seed layers 112 are exposed (hereinafter, these mask layers will be referred to as etching mask layers 120) are formed on the underlayer 115, and then the underlayer 115 is selectively removed. Subsequently, the etching mask layers 120 are removed, followed by epitaxial growth of a second underlayer 121 on the underlayer 115.

Figure 7A:
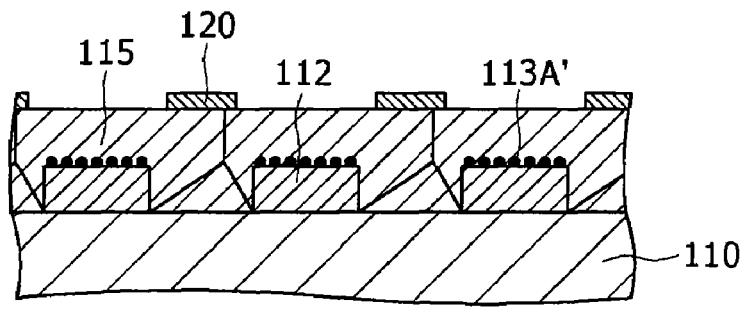
FIGS. 7A to 7D are schematic partial sectional views of a sapphire substrate and so on, for explaining a method for forming an underlayer composed of a GaN-based compound semiconductor and a method for manufacturing a GaN-based semiconductor light-emitting element of an embodiment.
Figure 7B:
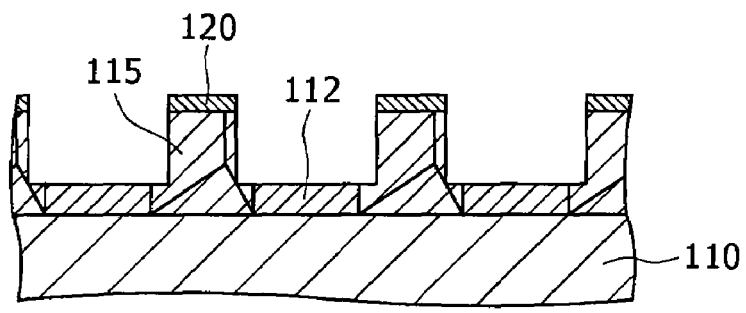
Figure 7C:
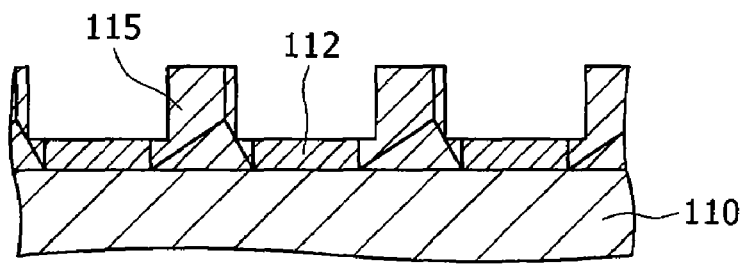
Figure 7D:
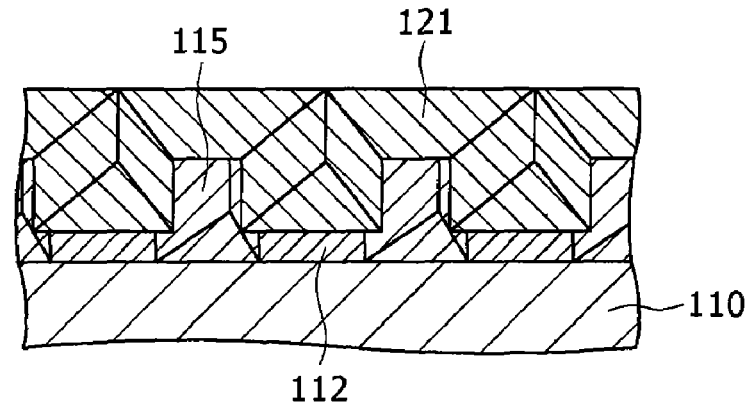

More specifically, subsequently to [Step-510] in the fifth embodiment, the etching mask layers 120 that are composed of Ni and expose the parts of the underlayer 115 above the seed layers 112 are formed on the underlayer 115 based on lift-off (see FIG. 7A). The length of the exposed parts of the underlayer 115 is set to 6 µm. Subsequently, the underlayer 115 is etched by RIE employing a chlorine gas. Furthermore, in the sixth embodiment, the seed layers 112 are partially etched (see FIG. 7B), and then the etching mask layers 120 are removed (see FIG. 7C). The total etching depth of the underlayer 115 and the seed layers 112 is set to 6 µm. Thereafter, the sapphire substrate 110 is loaded into the MOCVD apparatus again, and therein the second underlayer 121 composed of undoped GaN is epitaxially grown at a substrate temperature of 1050° C. under an atmospheric pressure from the top surfaces and both the side surfaces of the underlayers 115, and from the top surfaces of the seed layers 112, so that the spaces arising from partial etching of the underlayer 115 are filled with the second underlayer 121 (see FIG. 7D). Almost no dislocation exists in the vicinity of the top surface (A-plane) of the second underlayer 121, other than at the joint parts between the grown crystals of the second underlayer 121. The above-described steps may be executed only one time, or alternatively executed plural times.

Thereafter, a step similar to [Step-520] in the fifth embodiment is carried out.

A seventh embodiment is also a modification of the fifth embodiment. In the sixth embodiment, the parts of the underlayer 115 above the seed layers 112 are selectively removed. In contrast, in the seventh embodiment, second mask layers (hereinafter, referred to as crystal growth inhibiting mask layers 130) are formed on the parts of the underlayer 115 above the seed layers 112. Subsequently, a second underlayer 131 is epitaxially grown in a lateral direction (ELO-grown) from the parts of the underlayer 115 that are not covered by the crystal growth inhibiting mask layers 130 and hence exposed.

The crystal growth of the second underlayer 131 does not occur on the crystal growth inhibiting mask layers 130, but is started on the top surfaces of the underlayer 115, so that the second underlayer 131 extends over the crystal growth inhibiting mask layers 130. Specific examples of the crystal growth inhibiting mask layer 130 are similar to those of the crystal growth inhibiting mask layer 30 in the third embodiment.

Figure 8A:
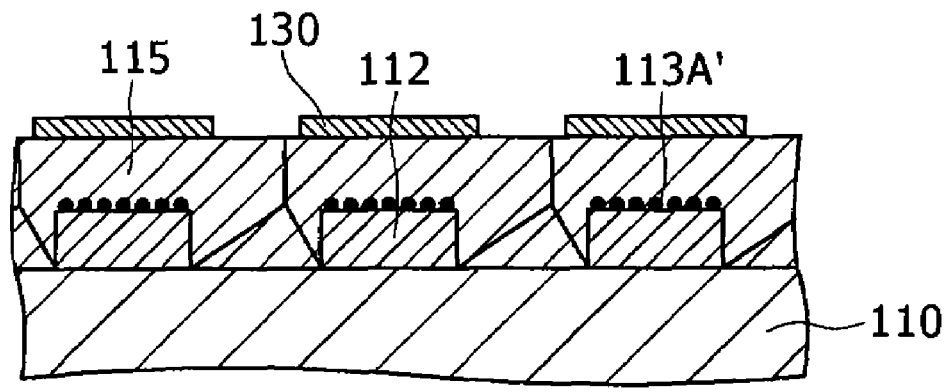
FIGS. 8A and 8B are schematic partial sectional views of a sapphire substrate and so on, for explaining a method for forming an underlayer composed of a GaN-based compound semiconductor and a method for manufacturing a GaN-based semiconductor light-emitting element of an embodiment.
Figure 8B:
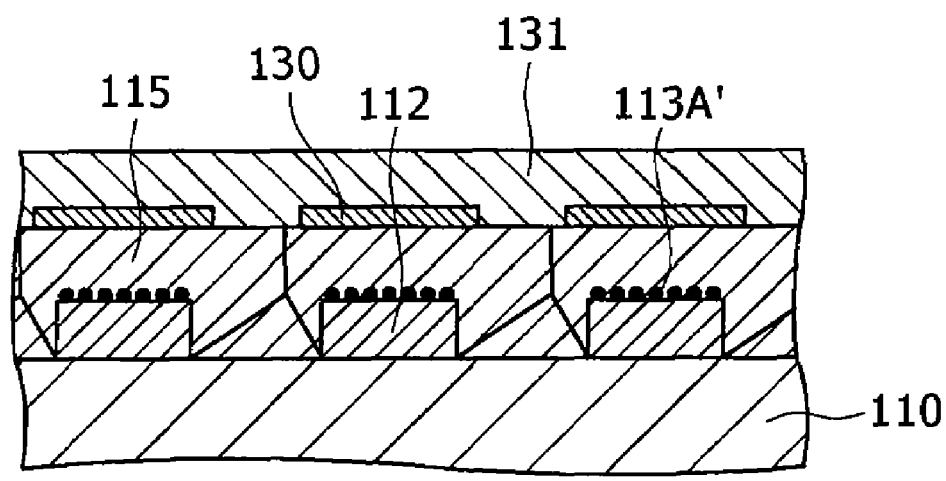
Figure 9A:
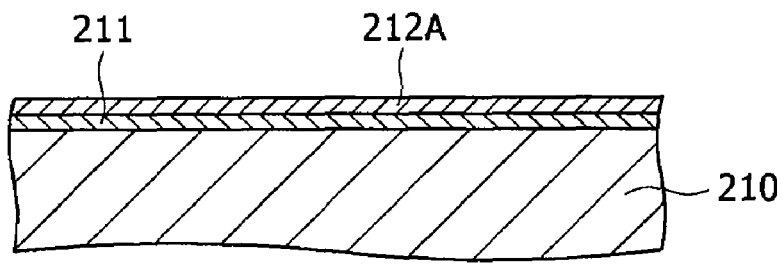
FIGS. 9A to 9C are schematic partial sectional views of a sapphire substrate and so on, for explaining an existing method for forming an underlayer composed of a GaN-based compound semiconductor and an existing method for manufacturing a GaN-based semiconductor light-emitting element.
Figure 9B:
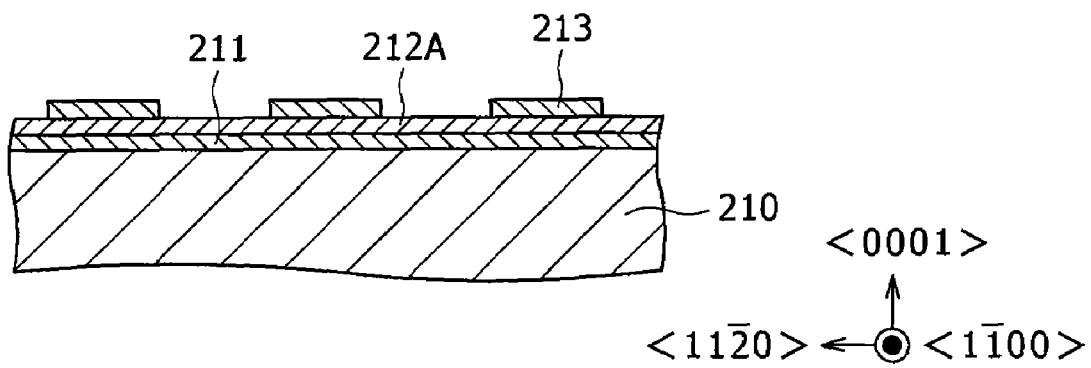
Figure 9C:
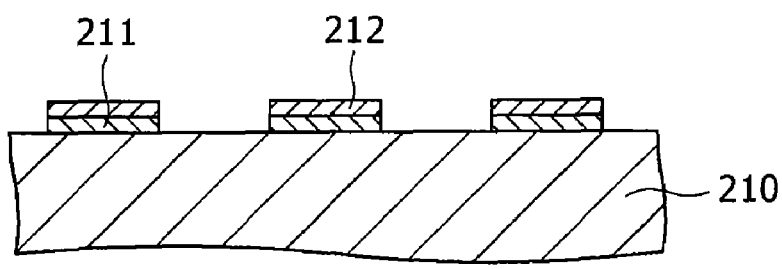
Figure 10A:
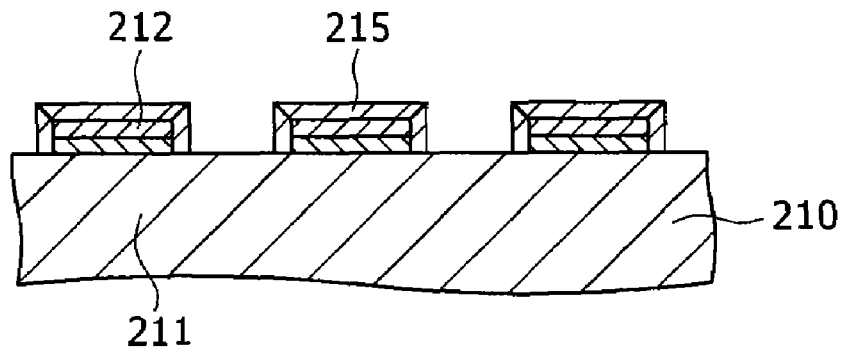
FIGS. 10A to 10C are schematic partial sectional views of the sapphire substrate and so on subsequent to FIG. 9C, for explaining the existing method for forming an underlayer composed of a GaN-based compound semiconductor and the existing method for manufacturing a GaN-based semiconductor light-emitting element.
Figure 10B:
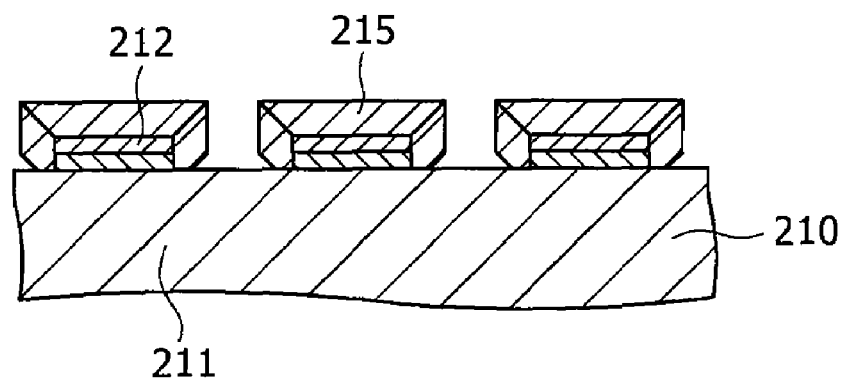
Figure 10C:
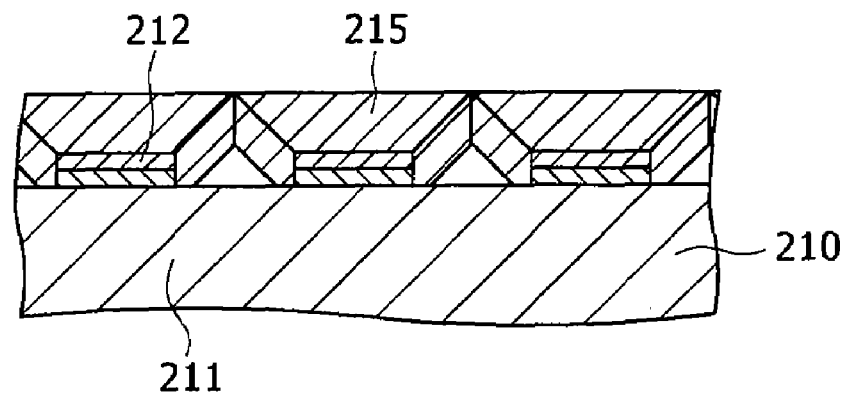
Figure 11A:
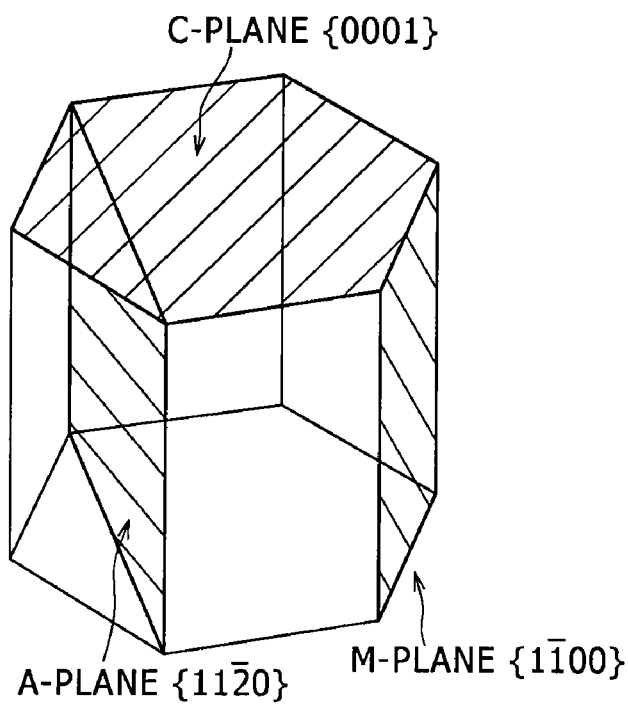
FIGS. 11A to 11C are diagrams for explaining the A-plane, C-plane, R-plane, and so on in a crystal of the hexagonal system.
Figure 11B:
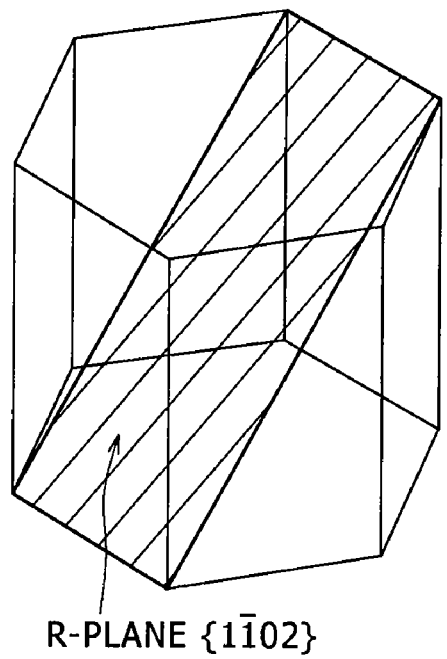
Figure 11C:
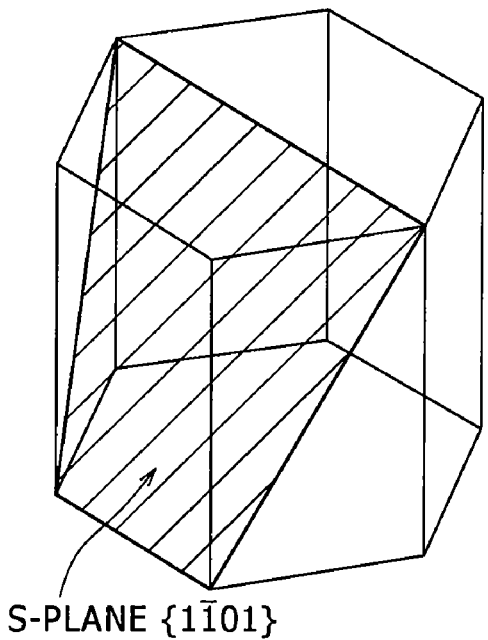

The specific step flow is as follows. Subsequently to [Step-510] in the fifth embodiment, the crystal growth inhibiting mask layers 130 formed of a silicon oxide layer are formed on the parts of the underlayer 115 above the seed layers 112 by sputtering and etching. The crystal growth inhibiting mask layers 130 extend in parallel to the seed layers 112 (see FIG. 8A). Subsequently, the sapphire substrate 110 is loaded into the MOCVD apparatus again, and therein the second underlayer 131 composed of undoped GaN is ELO-grown from the exposed parts of the underlayer 115 at a substrate temperature of 1050° C. under an atmospheric pressure, so that the underlayer 115 and the crystal growth inhibiting mask layers 130 are covered by the second underlayer 131 (see FIG. 8B). The second underlayer 131 includes almost no dislocation.

Thereafter, a step similar to [Step-520] in the fifth embodiment is carried out.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method for forming an underlayer composed of a GaN-based compound semiconductor, the method comprising the steps of:
   (A) forming a strip seed layer composed of a GaN-based compound semiconductor on a surface of a sapphire substrate;
   (B) forming a crystal growth promoting layer composed of a GaN-based compound semiconductor on a top surface and both side surfaces of the seed layer, and on an exposed surface of the sapphire substrate; and
   (C) epitaxially growing an underlayer composed of a GaN-based compound semiconductor from a part of the crystal growth promoting layer on the top surface of the seed layer, a part of the crystal growth promoting layer on both the side surfaces of the seed layer, and a part of the crystal growth promoting layer on the exposed surface of the sapphire substrate.

2. The method for forming the underlayer composed of the GaN-based compound semiconductor according to claim 1, wherein
   Equation (1) is satisfied
   $$T \geq (W_p - W_s)/2 \tag{1}$$
   where $W_s$ is a width of the seed layer, T is a thickness of the seed layer, and $W_p$ is a formation pitch of the seed layer.

3. The method for forming the underlayer composed of the GaN-based compound semiconductor according to claim 1, the method further comprising the steps of:
   subsequently to the step (C), forming on the underlayer a mask layer through which a part of the underlayer above the seed layer is exposed, and then selectively removing the underlayer; and
   removing the mask layer, and then epitaxially growing a second underlayer on the underlayer.

4. The method for forming the underlayer composed of the GaN-based compound semiconductor according to claim 1, the method further comprising the steps of:
   subsequently to the step (C), forming a mask layer that covers a part of the underlayer above the seed layer; and
   epitaxially growing a second underlayer in a lateral direction from a part of the underlayer not covered by the mask layer.

5. The method for forming the underlayer composed of the GaN-based compound semiconductor according to claim 1, wherein
   the surface of the sapphire substrate is a C-plane.

6. The method for forming the underlayer composed of the GaN-based compound semiconductor according to claim 1, wherein
   the surface of the sapphire substrate is an R-plane.

7. A method for forming an underlayer composed of a GaN-based compound semiconductor, the method comprising the steps of:
   (A) forming on a surface of an R-plane sapphire substrate a strip seed layer that is composed of a GaN-based compound semiconductor and has a crystal growth inhibiting substance on a top surface of the seed layer; and
   (B) epitaxially growing an underlayer composed of a GaN-based compound semiconductor from a top surface and both side surfaces of the seed layer, and from an exposed surface of the sapphire substrate.

8. The method for forming the underlayer composed of the GaN-based compound semiconductor according to claim 7, wherein
   the step (A) includes the sub-steps of:
   (A-1) forming a seed layer forming film composed of a GaN-based compound semiconductor on the surface of the R-plane sapphire substrate;
   (A-2) sequentially forming a crystal growth inhibiting substance layer and a mask layer on the seed layer forming film;
   (A-3) selectively removing the mask layer and the crystal growth inhibiting substance layer to thereby selectively expose the seed layer forming film;
   (A-4) removing the exposed seed layer forming film to thereby form the strip seed layer; and
   (A-5) removing the mask layer and the crystal growth inhibiting substance layer on the seed layer so that the crystal growth inhibiting substance is left on the top surface of the seed layer.

9. The method for forming the underlayer composed of the GaN-based compound semiconductor according to claim 7, the method further comprising the steps of:
   subsequently to the step (B), forming on the underlayer a second mask layer through which a part of the underlayer above the seed layer is exposed, and then selectively removing the underlayer; and
   removing the second mask layer, and then epitaxially growing a second underlayer on the underlayer.

10. The method for forming the underlayer composed of the GaN-based compound semiconductor according to claim 7, the method further comprising the steps of:
    subsequently to the step (B), forming a second mask layer that covers a part of the underlayer above the seed layer; and
    epitaxially growing a second underlayer in a lateral direction from a part of the underlayer not covered by the second mask layer.

11. The method for forming the underlayer composed of the GaN-based compound semiconductor according to claim 7, wherein
    the crystal growth inhibiting substance is a refractory metal.

12. The method for forming the underlayer composed of the GaN-based compound semiconductor according to claim 11, wherein
    the crystal growth inhibiting substance is titanium.

13. The method for forming the underlayer composed of the GaN-based compound semiconductor according to claim 7, wherein
    Equation (1) is satisfied
    $$T \geq (W_p - W_s)/2 \tag{1}$$
    where $W_s$ is a width of the seed layer, T is a thickness of the seed layer, and $W_p$ is a formation pitch of the seed layer.

14. A method for manufacturing a GaN-based semiconductor light-emitting element, the method comprising the steps of:
    (A) forming a strip seed layer composed of a GaN-based compound semiconductor on a surface of a sapphire substrate;
    (B) forming a crystal growth promoting layer composed of a GaN-based compound semiconductor on a top surface and both side surfaces of the seed layer, and on an exposed surface of the sapphire substrate; and
    (C) epitaxially growing an underlayer composed of a GaN-based compound semiconductor from a part of the crystal growth promoting layer on the top surface of the seed layer, a part of the crystal growth promoting layer on both the side surfaces of the seed layer, and a part of the crystal growth promoting layer on the exposed surface of the sapphire substrate.

15. The method for manufacturing the GaN-based semiconductor light-emitting element according to claim 14, the method further comprising the step of subsequently to the step (C), sequentially forming over the underlayer a first GaN-based compound semiconductor layer of a first conductivity type, an active layer composed of a GaN-based compound semiconductor, and a second GaN-based compound semiconductor layer of a second conductivity type.

16. A method for manufacturing a GaN-based semiconductor light-emitting element, the method comprising the steps of:
 (A) forming on a surface of an R-plane sapphire substrate a strip seed layer that is composed of a GaN-based compound semiconductor and has a crystal growth inhibiting substance on a top surface of the seed layer; and
 (B) epitaxially growing an underlayer composed of a GaN-based compound semiconductor from a top surface and both side surfaces of the seed layer, and from an exposed surface of the sapphire substrate.

17. The method for manufacturing the GaN-based semiconductor light-emitting element according to claim 16, the method further comprising the step of
 subsequently to the step (B), sequentially forming over the underlayer a first GaN-based compound semiconductor layer of a first conductivity type, an active layer composed of a GaN-based compound semiconductor, and a second GaN-based compound semiconductor layer of a second conductivity type.

* * * * *